(12) United States Patent
Ice

(10) Patent No.: US 7,349,226 B2
(45) Date of Patent: Mar. 25, 2008

(54) FUNCTIONAL MODULE WITH CARD GUIDE ENGAGEMENT FEATURE

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 95 days.

(21) Appl. No.: 10/638,982

(22) Filed: Aug. 12, 2003

(65) Prior Publication Data

US 2004/0032714 A1    Feb. 19, 2004

Related U.S. Application Data

(60) Provisional application No. 60/422,565, filed on Oct. 31, 2002, provisional application No. 60/403,323, filed on Aug. 13, 2002.

(51) Int. Cl.
  H05K 7/14 (2006.01)
  H05K 7/18 (2006.01)
(52) U.S. Cl. ............... 361/796; 361/801; 361/802
(58) Field of Classification Search .......... 361/752, 361/753, 756, 759, 761, 763, 686, 796–802
See application file for complete search history.

(56) References Cited

U.S. PATENT DOCUMENTS

| | | | | |
|---|---|---|---|---|
| 3,533,045 A | * | 10/1970 | Henschen | 439/62 |
| 3,733,523 A | * | 5/1973 | Reynolds et al. | 361/802 |
| 4,068,290 A | * | 1/1978 | Wetherbee | 361/802 |
| 4,241,381 A | * | 12/1980 | Cobaugh et al. | 361/785 |
| 4,327,835 A | | 5/1982 | Leger | |
| 4,546,414 A | * | 10/1985 | Donges | 361/786 |
| 4,869,672 A | * | 9/1989 | Andrews, Jr. | 439/60 |
| 4,964,810 A | | 10/1990 | Malotke et al. | |
| 5,052,936 A | * | 10/1991 | Biechler et al. | 439/60 |
| 5,163,847 A | * | 11/1992 | Regnier | 439/157 |
| 5,175,669 A | | 12/1992 | Navia et al. | |
| 5,211,568 A | * | 5/1993 | Yamada et al. | 439/157 |
| 5,387,132 A | * | 2/1995 | Sarver et al. | 439/633 |
| 5,394,305 A | | 2/1995 | Moral et al. | |
| 5,642,264 A | * | 6/1997 | Cantrell | 361/802 |
| 5,666,271 A | | 9/1997 | Kim et al. | |
| 5,715,669 A | | 2/1998 | Hasegawa et al. | |
| 5,769,668 A | * | 6/1998 | Tondreault | 439/633 |
| 5,808,866 A | | 9/1998 | Porter | |
| 5,812,377 A | * | 9/1998 | Golbach | 361/759 |

(Continued)

OTHER PUBLICATIONS

U.S. Appl. No. 10/639,064, filed Aug. 12, 2003, Ice.

(Continued)

*Primary Examiner*—Tuan T. Dinh
(74) *Attorney, Agent, or Firm*—Workman Nydegger

(57) ABSTRACT

A functional module is provided for use in conjunction with an electronic equipment enclosure that includes a card cage having two end card guides and one or more middle card guides interposed between the end card guides. The functional module includes a double-wide card that is configured to be removably received in the card cage. The double-wide card includes electronic circuitry and defines a cutout configured to engage a middle card guide. When the functional module is operably positioned in the electronic equipment enclosure, the edges of the double wide card are supported by the end card guide and the cutout engages the middle card guide so that the double-wide card straddles the middle card guide and is supported thereby.

19 Claims, 9 Drawing Sheets

U.S. PATENT DOCUMENTS

| | | |
|---|---|---|
| 5,872,701 A * | 2/1999 | Hayden et al. ............. 361/786 |
| 5,912,799 A | 6/1999 | Grouell et al. |
| 6,008,995 A * | 12/1999 | Pusateri et al. ............. 361/796 |
| 6,030,230 A | 2/2000 | Peacock |
| 6,038,126 A | 3/2000 | Weng |
| 6,166,917 A | 12/2000 | Anderson |
| 6,195,262 B1 | 2/2001 | Bodette et al. |
| 6,198,633 B1 | 3/2001 | Lehman et al. |
| 6,205,033 B1 | 3/2001 | Kelemen |
| 6,335,868 B1 * | 1/2002 | Butterbaugh et al. ....... 361/796 |
| 6,373,712 B1 * | 4/2002 | Bailis et al. ................. 361/756 |
| 6,385,053 B1 | 5/2002 | Parizi et al. |
| 6,466,449 B1 | 10/2002 | Sheen et al. |
| 6,522,554 B1 * | 2/2003 | Gomez et al. ............. 361/756 |
| 6,542,383 B1 | 4/2003 | Tsuyuki et al. |
| 6,580,616 B2 | 6/2003 | Greenside et al. |
| 6,646,868 B2 * | 11/2003 | Ho et al. .................... 361/684 |
| 6,646,890 B1 * | 11/2003 | Byers et al. ................ 361/802 |
| 6,661,651 B1 | 12/2003 | Tanzer et al. |
| 6,661,673 B2 | 12/2003 | Brooks et al. |
| 6,728,114 B2 | 4/2004 | Serjack et al. |
| 6,771,513 B2 | 8/2004 | LaMothe et al. |
| 6,999,319 B2 | 2/2006 | Wu et al. |
| 7,042,737 B1 | 5/2006 | Woolsey et al. |
| 2004/0031767 A1 | 2/2004 | Ice |
| 2004/0032714 A1 | 2/2004 | Ice |
| 2004/0032715 A1 | 2/2004 | Ice |
| 2004/0037054 A1 | 2/2004 | Ice |
| 2004/0212973 A1 | 10/2004 | Ice |
| 2005/0135077 A1 | 6/2005 | Ice |

OTHER PUBLICATIONS

U.S. Appl. No. 10/638,981, filed Aug. 12, 2003, Ice.
U.S. Appl. No. 10/639,211, filed Aug. 12, 2003, Ice.
U.S. Appl. No. 10/772,924, filed Feb. 5, 2004, Ice.
Documentation entitled "Self-Clinching Cable Tie-Mount", copyright 2001 by PEM Fastening Systems, a PennEngineering company (4 pages).

* cited by examiner

FUNCTIONAL MODULE WITH CARD GUIDE ENGAGEMENT FEATURE

CROSS-REFERENCE TO RELATED APPLICATIONS

This application claims the benefit of U.S. Provisional Patent Application Nos. 60/403,323, entitled PLUG-IN MODULE WITH CARD GUIDE ENGAGEMENT SLOT and filed on Aug. 13, 2002, and 60/422,565, entitled FUNCTIONAL MODULE WITH CARD GUIDE ENGAGEMENT FEATURE and filed on Oct. 31, 2002, both of which are incorporated herein in their respective entireties by this reference.

Further, this application hereby incorporates, in their respective entireties, the following U.S. patent applications filed the same day herewith: U.S. patent application Ser. No. 10/638,981, entitled CARD CAGE SYSTEM, now U.S. Pat. No. 7,167,380 issued Jan. 23, 2007; U.S. patent application Ser. No. 10/639,064, entitled ADAPTER ELEMENT FOR CARD CAGE SYSTEM, now U.S. Pat. No. 7,210,586 issued May 1, 2007; and, U.S. patent application Ser. No. 10/639,211, entitled ELECTROMAGNETIC RADIATION CONTAINMENT SYSTEM.

BACKGROUND

1. Technological Field

Embodiments of the invention are generally concerned with functional modules suited for use in electronic equipment enclosures. More particularly, embodiments of the invention relate to a functional module having a relatively wide card that includes features directed to permitting the card to be operably positioned in card support environments that include structure that would substantially hinder or prevent the use of conventional cards.

2. Related Technology

Electronic equipment enclosures are used in a variety of different industries and applications and generally serve to receive one or more pieces of electronic equipment and devices in such a way that the pieces of electronic equipment can operably interact with each other and/or with the electronic equipment enclosure. In particular, such electronic equipment enclosures typically include features directed to permitting the use of one or more "plug-in" functional modules that electrically and mechanically interface with the electronic equipment enclosure and/or with other functional modules, and that can be removed and/or replaced as desired.

To this end, many electronic equipment enclosures include internal structures configured to removably receive one or more functional modules in a desired arrangement. Such internal structures are often referred to as "card cages." The card cage is configured so as to allow a user to modify the functionality associated with the electronic equipment enclosure by selecting particular functional modules to be employed in the electronic equipment enclosure. Specifically, the functionality associated with a particular electronic equipment enclosure can be modified by adding and/or removing selected functional modules having desired functional aspects to/from the card cage. While their respective functionalities may differ however, many of such functional modules nonetheless share a number of similar structural features.

For example, typical functional modules employed in conjunction with card cages include a printed circuit board, or "card," attached to a front panel that may include various indicators, readouts, and/or connectors. Circuitry disposed on the card communicates with such indicators, readouts and connectors and serves to implement the functionality associated with that particular functional module. Various connectors on the rear of the card permit communication between the functional module and other functional modules or components associated with the electronic equipment enclosure. Finally, the front panel of the functional module typically includes one or more fasteners that engage corresponding structure of the card cage to aid in removable retention of the functional module within the card cage.

While functional modules such as those just described have proven useful in many regards, they nevertheless suffer from certain limitations. Some areas of particular concern relate to the configuration of the cards typically employed in many functional modules, and to the relation between such cards and card storage environments such as card cages.

For example, conventional card cages configured to accommodate two singlewide cards in an edge-to-edge arrangement necessarily include a central structural element that defines a guide rail on either side so as to provide support to an edge of each of the single-wide cards when those cards are received in the card cage. However, the presence of the center structural element effectively prevents use of a double-wide, or larger, card in the same slot of the card cage.

In particular, the center guide rails typically extend to the front of the equipment enclosure chassis and thus act to prevent insertion of the double-wide, or larger, card by blocking the path of the card edge. Such configurations materially impair, among other things, the flexibility and the usefulness of conventional electronic equipment enclosures by acting as a constraint on the size of the functional modules that may be employed in the card cage. Thus, the functionality associated with a relatively wider functional module that includes a double-wide or larger card, can only be implemented, if at all, by positioning a series of relatively narrow cards, such as single-wide cards, above one another in the card cage. As discussed below however, such arrangements can be problematic in some circumstances.

For example, each separate card must have its own electrical connection with the connectors on the card cage backplane. Moreover, the separate cards may each include structure, circuitry, or connections such as cables, for electrical communication with adjacent, or other, cards in the card cage system. Such requirements contribute to relatively high production costs for functional modules having these types of cards, and also serve to complicate installation. Further, in the event a functional module fails to operate properly, the use of a relatively larger number of electrical interfaces and connections impairs troubleshooting, diagnosis, and repair of the functional module.

Problems such as these are of particular concern where a pair of relatively small, such as single-wide, functional modules are used to implement various types of multichannel applications. This is due to the fact that in situations such as these, the operation and functionality of one module of the pair may be closely tied to the operation and functionality of the other module of the pair, requiring a large number of specialized or high speed connections directly between the functional modules rather than through the standardized backplane.

In view of the foregoing problems, and other problems in the art not specifically enumerated herein, what is needed is a functional module and associated card having features that permit the card to be operably positioned in card support environments configured for use with card geometries that are materially different from the geometry of the card of the functional module. Further, the functionality of the card should not be materially impaired by virtue of its being compatible with such card support environments.

BRIEF SUMMARY OF AN EXEMPLARY EMBODIMENT OF THE INVENTION

In general, embodiments of the invention are concerned with a functional module having a relatively wide card that includes features directed to permitting the card to be operably positioned in card support environments that include structure that would substantially hinder or prevent the use of conventional cards.

In one exemplary embodiment of the invention, a functional module is provided that is configured to be removably received by an electronic equipment enclosure having a card cage structure that includes two end card guides and a middle card guide interposed between the end card guides in a spaced apart configuration suited for receiving two single-wide cards in a side-by-side arrangement.

The functional module includes a double-wide card having circuitry suitable for implementing the functionality of the card. In this exemplary embodiment, the card defines a cutout generally located and arranged to be aligned with the middle card guide when the functional module is positioned for insertion into the electronic equipment enclosure. Additionally, various electrical connectors on the card permit communication between the functional module and other functional modules or components associated with the electronic equipment enclosure. The card is attached to a front panel that comprises a variety of indicators, readouts, and input and output connectors configured and arranged for communication with the circuitry on the card. Further, the front panel of the functional module includes one or more fasteners which engage the card cage to aid in the secure retention of the functional module in the electronic equipment enclosure.

In operation, the functional module is positioned for insertion into the electronic equipment enclosure so that the cutout defined by the card lines up with the middle card guide, while the edges of the card line up with the end card guides. As the functional module is advanced into the electronic equipment enclosure, the cutout defined by the card engages the middle card guide so that the card straddles, and is supported by, the middle card guide. At the same time, each edge of the card is received in, and supported by, a corresponding end card guide. When the functional module has been operably positioned within the electronic equipment enclosure, the card is supported at its side edges as well as in the middle.

As a result of this configuration of the functional module, the flexibility of the electronic equipment enclosure is enhanced because the card of a double-wide functional module can be operably positioned in a card cage configured for use with single-wide cards. These and other aspects of embodiments of the invention will become more fully apparent from the following description and appended claims.

BRIEF DESCRIPTION OF THE DRAWINGS

In order that the manner in which the above-recited and other aspects of the invention are obtained, a more particular description of the invention briefly described above will be rendered by reference to specific embodiments thereof which are illustrated in the appended drawings. Understanding that these drawings depict only exemplary embodiments of the invention and are not therefore to be considered limiting of its scope, the invention will be described and explained with additional specificity and detail through the use of the accompanying drawings in which.

DETAILED DESCRIPTION OF EXEMPLARY EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

Generally, embodiments of the invention are concerned with a functional module that includes a card having a geometry that permits a double-wide, or larger, functional module to be operably positioned in a card storage environment, of an electronic equipment enclosure, that includes structure that would hinder or prevent such positioning of conventional double-wide, or larger, cards and functional modules. Exemplarily, the card includes one or more cutouts or other geometric features configured and arranged to engage the structure of the card storage environment in a way that permits the functional module to be operably positioned in the electronic equipment enclosure.

A variety of sizes, types, numbers and configurations of functional modules may include one or more cards such as those disclosed herein. For example, such cards may be employed in connection with single height modules, as well as with double height, or larger functional modules that include a plurality of PCBs disposed in a stacked arrangement. Additionally, embodiments of the invention are suited for use in connection with both horizontal and vertical card cage systems.

Directing attention now to FIGS. 1 through 3B, an exemplary embodiment of an electronic equipment enclosure is designated at 100. Various configurations of the electronic equipment enclosure 100 may be employed. By way of example, electronic equipment enclosure 100 may have a nominal height of 2U, 3U or 6U, depending upon the requirements of a particular application, wherein each increment of 1U corresponds to a distance of about one-and-three-quarters (1.75) inches. The foregoing dimensions are exemplary only however, and are not intended to limit the scope of the invention in any way. Moreover, electronic equipment enclosure 100 simply comprises one exemplary operating environment for embodiments of the invention. Accordingly, embodiments of the invention may be employed in various other environments as well.

Figure 1:
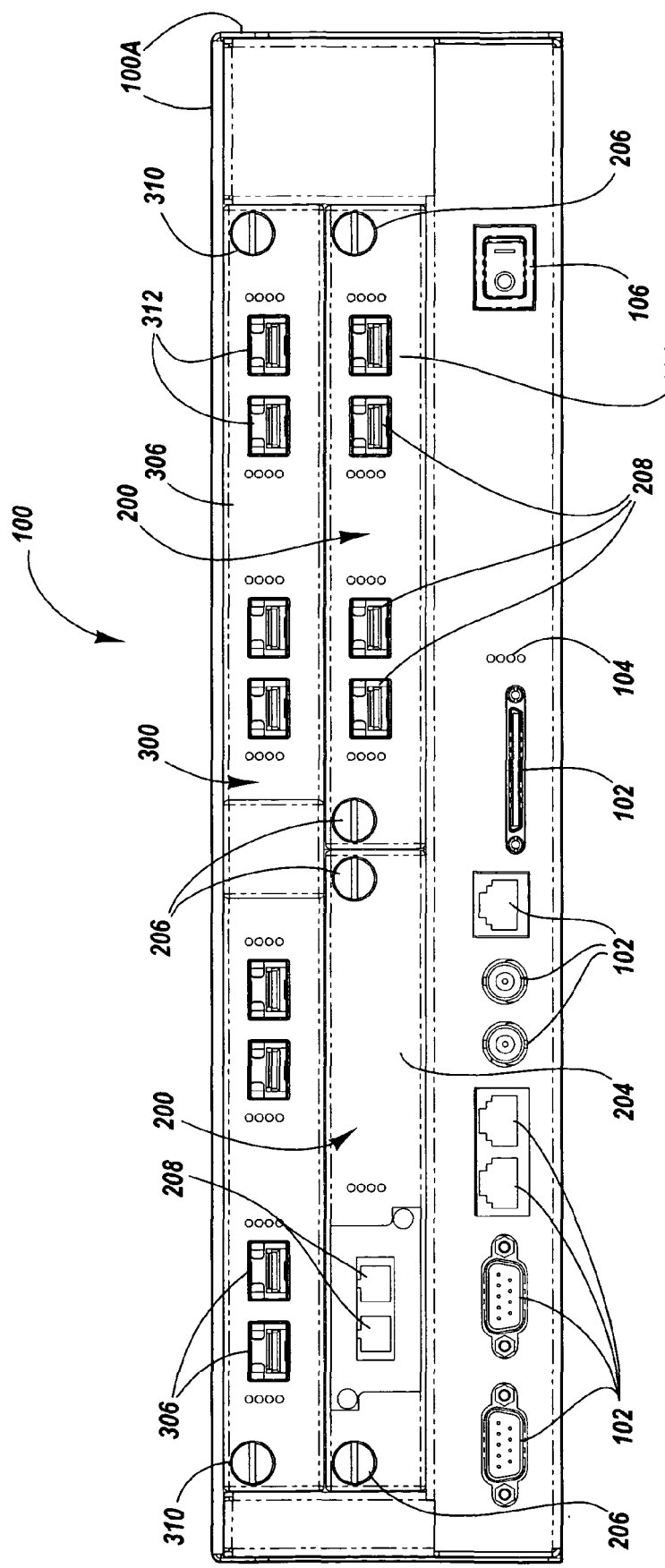
FIG. 1 is a front view illustrating an exemplary arrangement of various functional modules within an electronic equipment enclosure.
Figure 2:
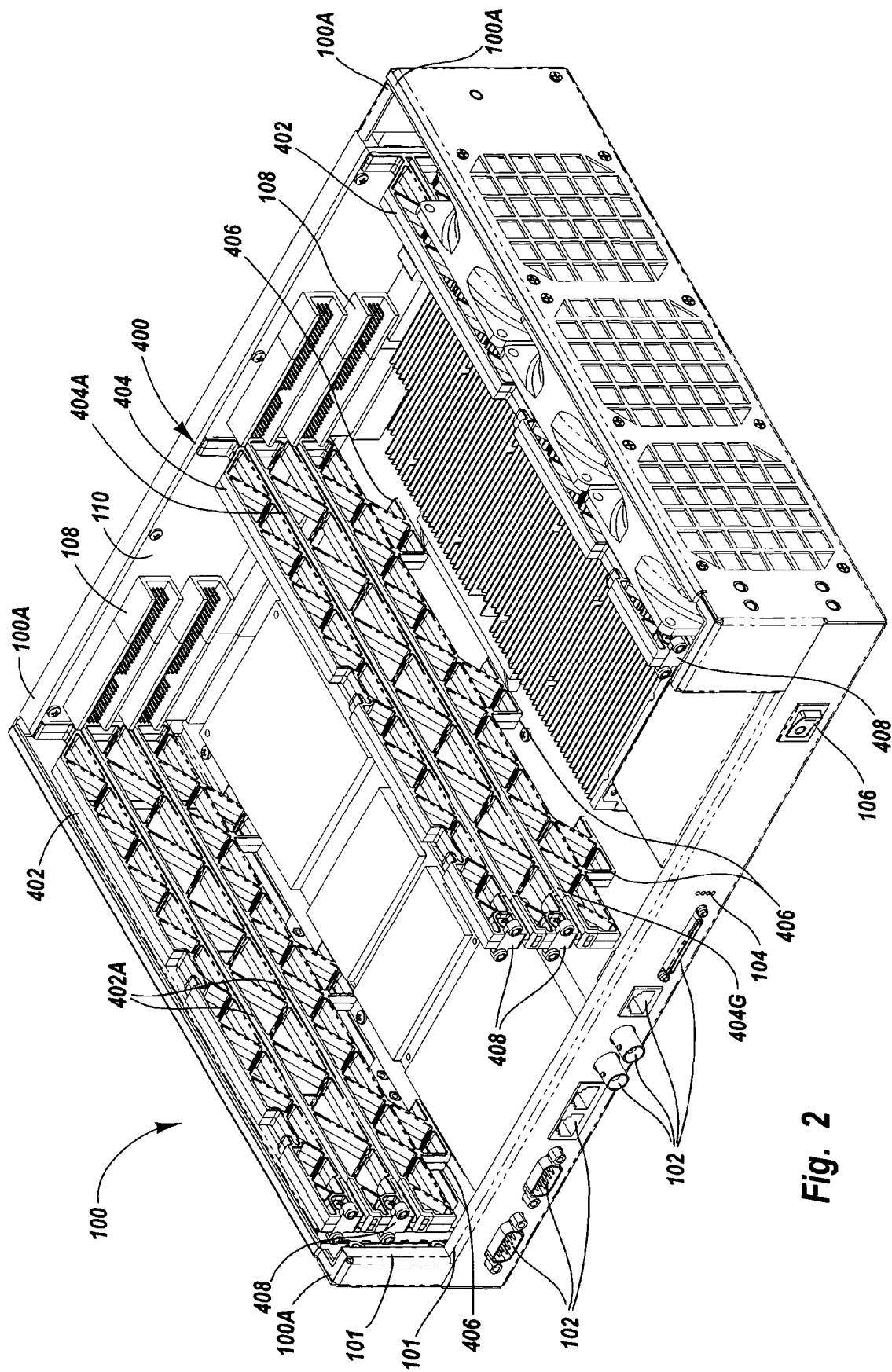
FIG. 2 is a front perspective view illustrating aspects of an exemplary electronic equipment enclosure (with cover and functional modules removed) and associated card cage in conjunction with which embodiments of the invention may be usefully employed.

As indicated in FIG. 1, the illustrated electronic equipment enclosure 100 includes a chassis 100A, one or more shielding elements 101 (see FIG. 2) various front connectors 102, indicators 104, a power switch 106, and rear connectors 108 disposed on backplane 110 (see FIG. 2). Various additional or alternative components may likewise be employed. In general, the front connectors 102 permit various external components and devices to communicate with one or more functional modules disposed in the electronic equipment enclosure 100.

In the exemplary illustrated embodiment, two single-wide functional modules 200 and one double-wide functional module 300 are positioned in the electronic equipment enclosure 100. Exemplary functionality for functional modules 200 and/or 300 includes, but is not limited to, various types of multi-channel applications. Of course, any other desired functionality may additionally, or alternatively, be implemented by way of functional modules 200 and/or 300 (see FIGS. 3A and 3B).

It should be noted in connection with the discussion herein that "single-wide" and "double-wide" refer to functional modules that include an associated card having a nominal width that is some multiple of a predetermined dimension. The use of such notation herein should not, however, be construed in any way to limit the scope of the invention to cards and/or functional modules of particular dimensions or configurations.

Moreover, the arrangement of single-wide functional modules 200 and double-wide functional module 300 illustrated in FIG. 1 is exemplary only, and various other arrangements of single-wide, double-wide, or other, functional modules may alternatively be employed. By way of example, an alternative arrangement includes two double-wide functional modules 300 stacked one on top of the other in a double height arrangement, but does not include any single-wide functional modules 200. In such a double height arrangement, the functional modules may, at the option of the user, be stacked on first and second card storage levels collectively defined by a card cage (see FIG. 2) of the electronic equipment enclosure 100. In other embodiments, triple height, or higher, arrangements may be employed. Yet another exemplary arrangement includes one or more triple-wide, or larger, functional modules employed either alone or in combination with functional modules of other sizes or configurations.

More generally then, aspects such as the size, arrangement, number, and functionality of the single-wide and double-wide functional modules 200 and 300, respectively, may be varied as necessary to suit the requirements of a particular application, and the scope of the invention should not be construed to be limited by the exemplary arrangements disclosed herein.

Directing more particular attention now to FIG. 1, single-wide functional module 200 includes a card 202 (see FIG. 4A) attached to a front panel 204 that includes fasteners 206 for removable retention of single-wide functional module 200 in card cage 400. Various connectors 208 on front panel 204 permit circuitry on card 202 to communicate with devices and systems external to single-wide functional module 200. Front panel 204 additionally includes a plurality of conductive elements 210 (see FIG. 4A) that generally aid in the reduction and/or control of EMI.

Note that the preceding treatment of various aspects of a single-wide functional module 200 is presented at this juncture at least partly in the interest of facilitating discussion of exemplary operating environments for embodiment of double-wide functional module 300, and details concerning an exemplary embodiment of double-wide functional module 300 are provided below in connection with the discussion of FIGS. 3A and 3B.

With specific attention now to FIG. 2, details are provided concerning further aspects of an exemplary electronic equipment enclosure 100, in conjunction with which various embodiments of single-wide and double-wide functional modules 200 and 300 may be employed. In particular, the illustrated embodiment of the electronic equipment enclosure 100 includes a card cage system 400 generally configured to removably receive cards of one or more functional modules of various types and sizes in any of a variety of different arrangements.

In the illustrated embodiment, card cage system 400 includes three double height card guides that cooperate to define first and second card storage levels. The a card guides, designated end card guide 402 and middle card guide 404, are disposed in a spaced-apart configuration with respect to each other. Of course, variables such as, but not limited to, the number, height, width, length, spacing, and the number of card storage levels collectively defined by, end card guides 402 and middle card guide(s) 404, as well as the number of card guides, may be varied as necessary to suit the requirements of a particular application.

With general reference to their construction and arrangement, end card guides 402 and middle card guide 404 each define channels configured to receive an edge, or other portion, of a card. In particular, each end card guide 402 defines, at each card storage level, a channel 402A that runs substantially the length of the card guide so as to slidingly receive an edge of a card as the associated functional module is advanced into the electronic equipment enclosure 100. Correspondingly, middle card guide 404 defines, at each card storage level, opposing channels 404A (only one of which is visible in FIGS. 2 and 4A) on either side of the middle card guide 404 that run substantially the length of the middle card guide 404 and are configured to receive an edge, or other portion, of a card.

Further, each of the end card guides 402 and middle card guide 404 exemplarily comprises a web configuration, or other suitable construction, and include structure (not shown) for facilitating attachment of the card guide to the floor, lid, backplane 110, chassis 100A, and/or other structural elements of the electronic equipment enclosure 100. Some embodiments of end card guides 402 and/or middle card guide 404 additionally include one or more positioning members 406. Generally, positioning members 406 are constructed and arranged to aid in disposing the card guide at a desired location and orientation within electronic equipment enclosure 100.

The exemplary embodiment of the card cage system 400 further comprises a plurality of adapter elements 408 configured to be removably positioned in the card guides and to interface with a functional module by receiving the fasteners of the functional module in bosses 408A (FIG. 5A) defined by the adapter element 408. Selective use of the adapter elements 408 thus permits ready configuration of the card cage system 400 to receive a desired number and arrangement of functional modules.

Figure 3A:
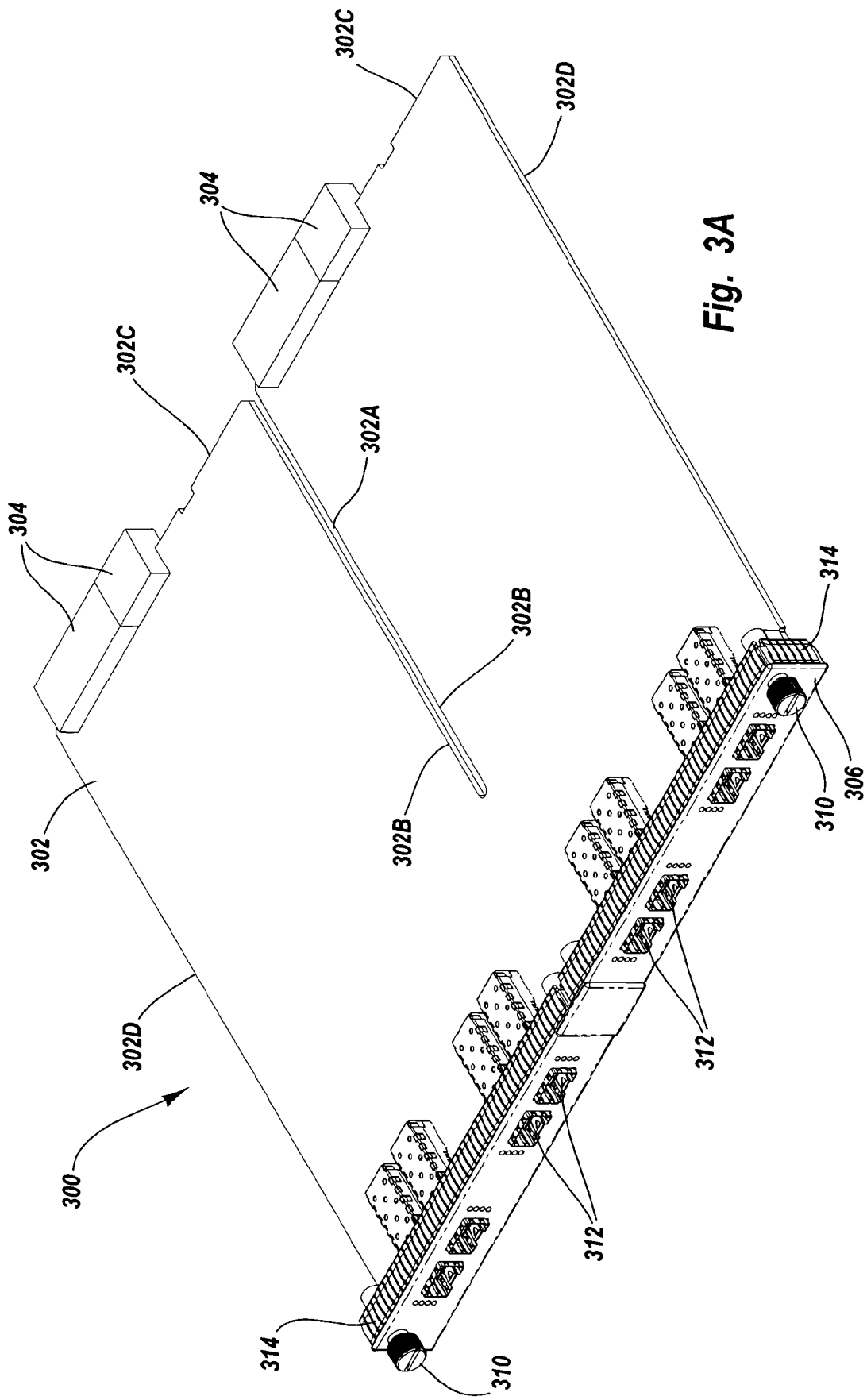
FIG. 3A is a front perspective view illustrating various aspects of an exemplary embodiment of a double-wide functional module.
Figure 3B:
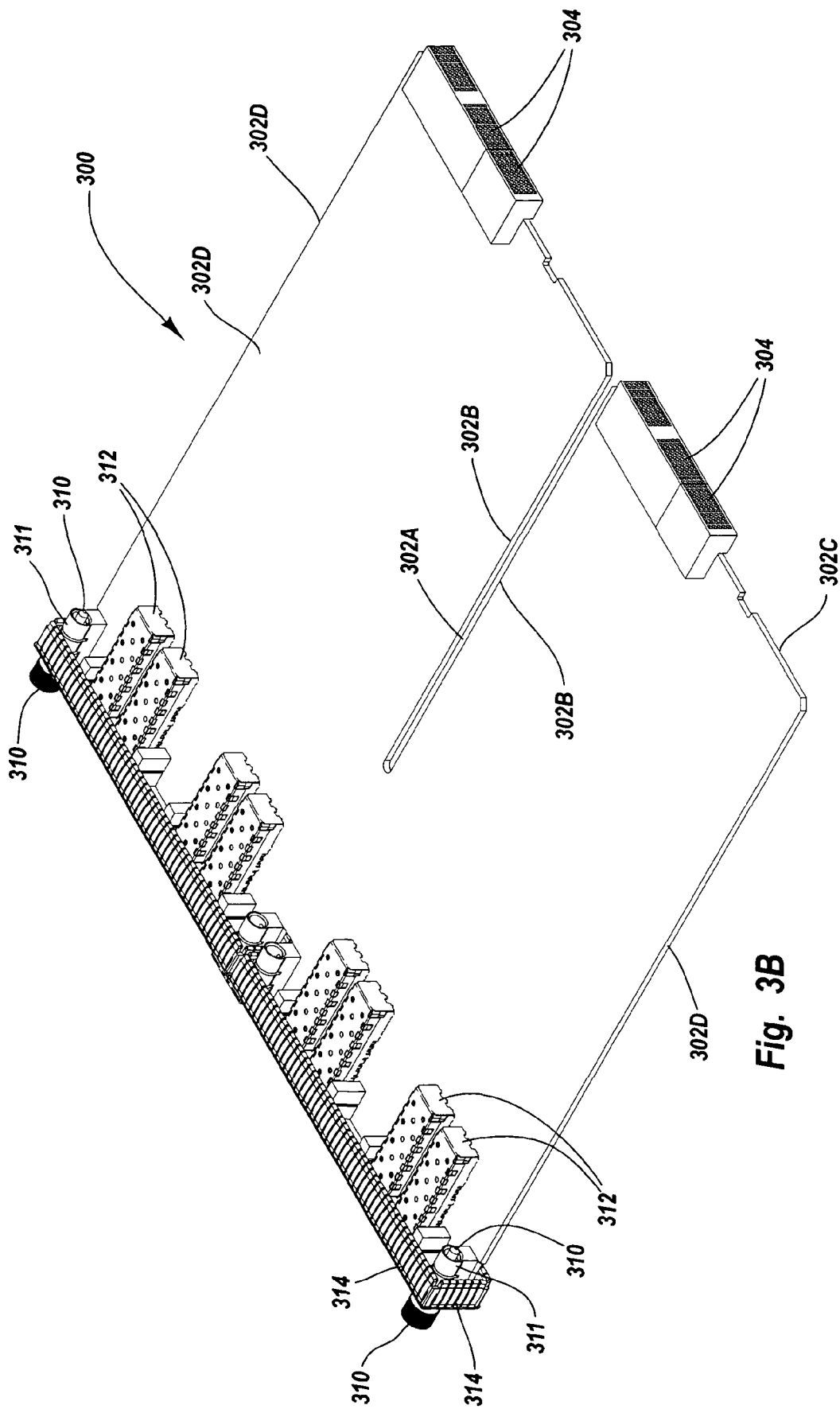
FIG. 3B is a rear perspective view illustrating various aspects of an exemplary embodiment of a double-wide functional module.

Directing particular attention now to FIGS. 3A and 3B, and with continuing reference to FIGS. 1 and 2, various aspects of an exemplary embodiment of double-wide functional module 300, such as may be employed in conjunction with environments such as card cage system 400, are considered. Generally, double-wide functional module 300 includes a double-wide card 302, which typically comprise a body upon which are disposed various electronic circuitry and devices (not shown), and/or other desired systems and components. Exemplarily, the double-wide card 302 comprises a printed circuit board ("PCB"). The electronic circuitry and devices disposed on double-wide card 302 serve to implement the particular functionality, or functionalities, associated with double-wide functional module 300. Moreover, such electronic circuitry and devices are arranged and configured to communicate electrically with various components, functional modules and devices within, and/or external to, electronic equipment enclosure 100.

In some embodiments, such electrical communication is achieved, at least in part, through the use of connectors 304 that are electrically connected with the circuitry and devices of double-wide card 302 and are configured and positioned to mechanically and electrically interface with corresponding connectors 108 disposed on the backplane 110 (see FIG. 2) of electronic equipment enclosure 100.

As further indicated in FIGS. 3A and 3B, double-wide card 302 defines at least one cutout 302A that, in the illustrated embodiment, comprises a slot having opposing edges 302B. Generally, implementation of one or more cutouts 302A, and/or other geometric features of equivalent functionality, permits double-wide functional module 300, or a larger functional module, to be operably positioned in the electronic equipment enclosure 100, notwithstanding the presence in the electronic equipment enclosure 100 of a card cage structure that would hinder or prevent such positioning of conventional double-wide, or larger, cards and functional modules.

In the illustrated embodiment, cutout 302A commences at the rear edge 302C of card 302 and extends along a substantial portion of the length of card 302. With respect to its location, the exemplary implementation of cutout 302A is laterally centered between, and generally parallel to, the side edges 302D of card 302. However, variables such as, but not limited to, the length, width, position, and orientation of cutout 302A may be varied as necessary to suit the requirements of a particular application or card storage environment. In general, each of the two halves of a double-wide functional module PCB containing cutout 302 are substantially similar to single wide functional module PCB. Moreover, multiple cutouts 302A may be employed in various alternative embodiments. Of course, any other structure(s) or features effective in implementing the functionality disclosed herein may alternatively be employed.

It should be noted in connection with the foregoing that the cutout 302, or cutouts, as applicable, defined by card 302 has no material effect on the functionality of the card 302. This is due at least in part to the fact that cards, such as may be used in multi-channel applications for example, can be readily designed and configured to minimize the number of signals that must cross from one side of the cutout 302 to the other.

Reference is now made to further aspects concerning the construction of double-wide functional module 300 and the relations between its various components. In particular, the double-wide card 302 is attached to a front panel 306 by way of fasteners 308 (see FIGS. 5A through 5C). The front panel 306 further includes one or more fasteners 310 that permit double-wide functional module 300 to be removably attached to card cage system 400 of electronic equipment enclosure 100.

In the exemplary embodiment illustrated in FIGS. 3A and 3B (see also FIGS. 5A through 5C), fasteners 310 comprise thumb screws that extend through front panel 306 and pass through corresponding lead-in structures 311 (FIG. 3B). Generally, the lead-in structures 311 are configured and arranged to engage corresponding structure (see boss 408A in FIGS. 5A and 5C) of an adapter element 408. Among other things, the lead-in structures 311 facilitate ready and reliable positioning of the fasteners 310 relative to the adapter element 408 when it is desired to install a functional module in the card cage. In this regard, the fasteners 310 additionally include a nose portion having a taper that is complementary with a countersink of a tapped hole defined in an adapter element, discussed below.

Of course, any other fastener or device having the functionality disclosed herein may alternatively be employed. Further details concerning aspects of an exemplary embodiment of fastener 310 are provided below in connection with the discussion of FIGS. 5A through 5C.

In addition to the connectors 304 noted earlier, double-wide functional module 300 further includes various connectors 312 that are accessible by way of front panel 306. Generally, such connectors 312 are electrically and mechanically configured to facilitate electrical communication between one or more external devices (not shown) and the circuitry (not shown) disposed on double-wide card 304 and/or the circuitry and electronic devices in communication with double-wide card 302 by way of connectors 304. Additional or alternative electrical devices and components may likewise be employed in conjunction with double-wide functional module 300. By way of example, some exemplary embodiments of double-wide functional module 300 include one or more readouts, indicators and feedback devices.

With continuing attention to FIGS. 3A and 3B, double-wide functional module 300 further includes a plurality of conductive elements 314 disposed about the perimeter of front panel 306. Generally, conductive elements 314 are useful in the control of electromagnetic emissions from the interior of electronic equipment enclosure 100, and thereby aid in the control and/or reduction of electromagnetic interference ("EMI") caused by components and circuitry associated with electronic equipment enclosure 1100.

Figure 4A:
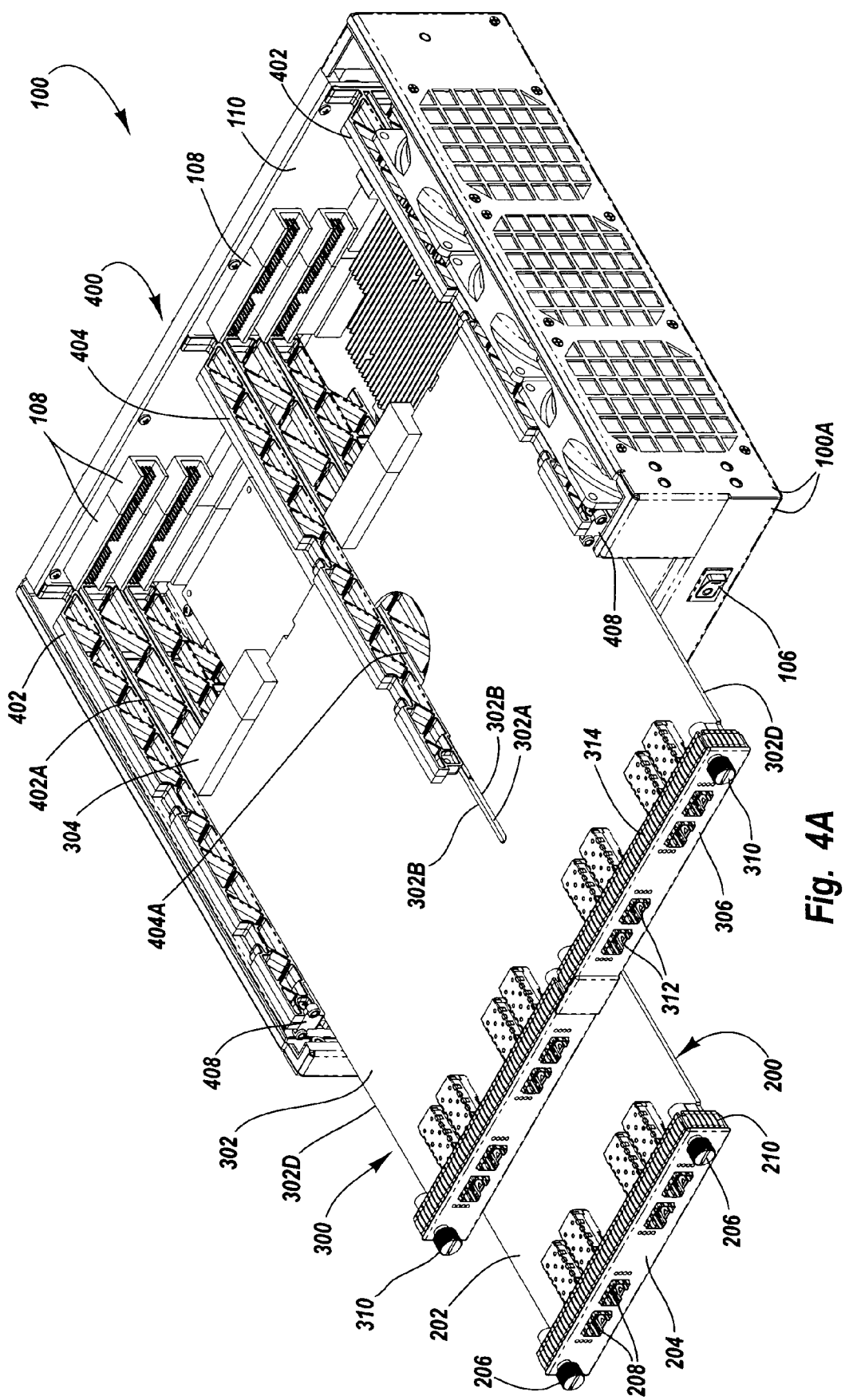
FIG. 4A is a front perspective cutaway view illustrating aspects of the installation of an exemplary embodiment of a single-wide functional module in an electronic equipment enclosure.
Figure 4B:
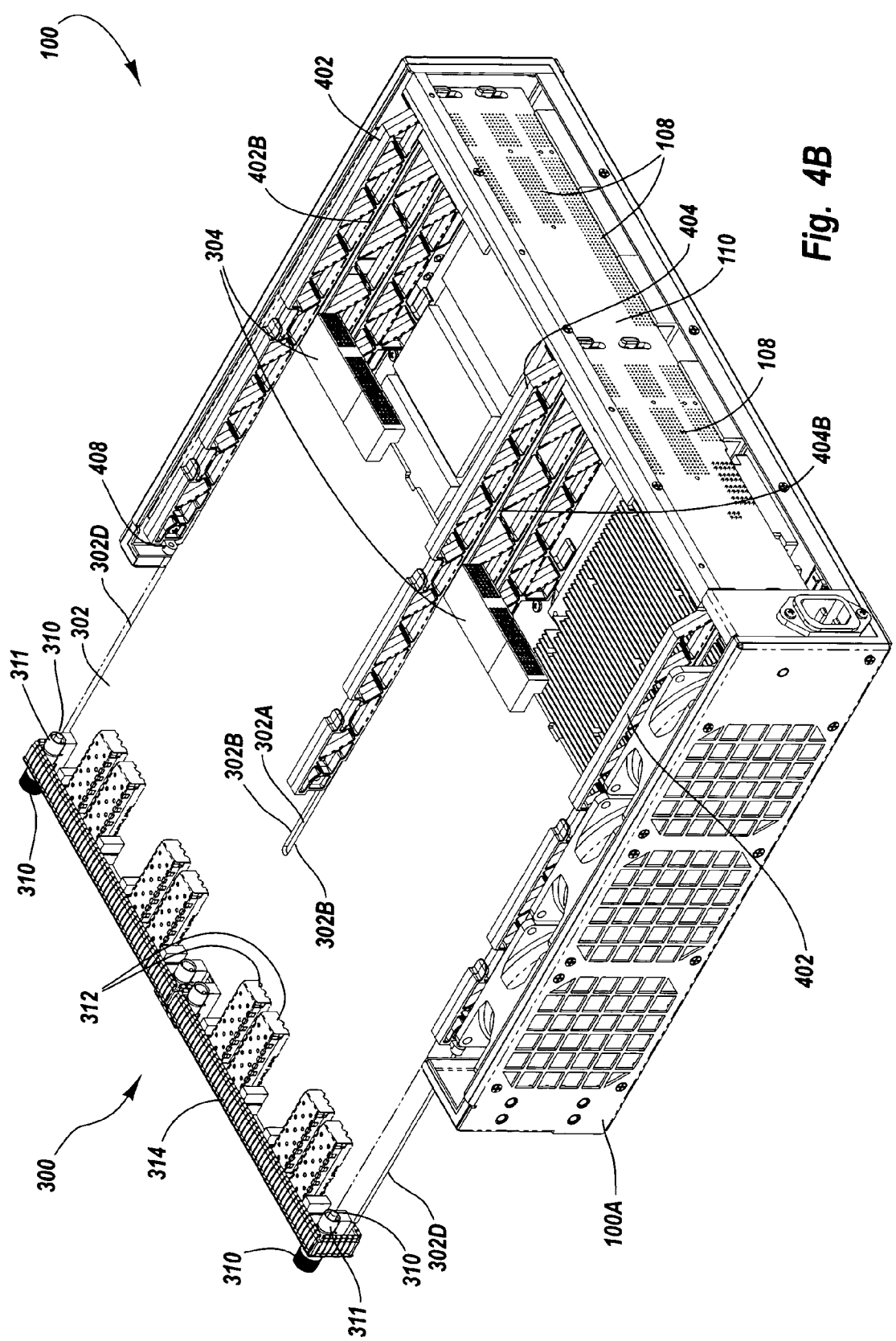
FIG. 4B is a rear perspective cutaway view illustrating aspects of the installation of an exemplary embodiment of a double-wide functional module in an electronic equipment enclosure.

Directing attention now to FIGS. 4A and 4B, details are provided concerning the positioning of an exemplary embodiment of double-wide functional module 300 in card cage system 400. Note that while the following discussion of FIGS. 4A and 4B is primarily directed to embodiments of the double-wide functional module 300, such discussion is generally germane to triple-wide, and larger, functional modules as well.

As suggested by the exemplary functional module arrangement illustrated in FIG. 4A, embodiments of the invention are suited for use in environments configured to receive single-wide functional modules 200 and, moreover, may be employed in such environments simultaneously with one or more single-wide functional modules 200. It should be noted here that card cage system 400 simply comprises one exemplary environment in which embodiments of the invention may be employed, and such exemplary employment should not be construed to limit the scope of the invention in any way. Rather, embodiments of the invention may usefully be employed in a variety of other environments as well.

As suggested in FIGS. 4A and 4B, double-wide functional module 300 is initially positioned for insertion into the electronic equipment enclosure 100 so that the cutout 302A defined by the card 302 generally lines up with the middle card guide 404, while the side edges 302D of the card 302 generally line up with the end card guides 402. At the same time, the fasteners 310 are substantially aligned with corresponding bosses 408A of the adapter elements 408 positioned in end card guides 402. In the illustrated arrangement, no adapter element 408 is present in the middle card guide 404.

As the double-wide functional module 300 is advanced into the electronic equipment enclosure 100, the edges 302B of the cutout 302A defined by the card 302 are received in the opposing channels 404A defined by the middle card guide 404 so that the card 302 straddles, and is supported by, the middle card guide 404. At the same time, each side edge 302D of the card 302 is received in, and supported by, the respective channels 402A defined by the corresponding end card guide 402. When the double-wide functional module 300 has been operably positioned within the electronic equipment enclosure 100, the card 302 straddles middle card guide 404 and is thus supported in the middle as well as at its side edges 302D. Once operably positioned in the electronic equipment enclosure 100 as described above, the double-wide functional module 300 is then secured in place.

One result of this configuration of the double-wide functional module 300 is that the flexibility of the electronic equipment enclosure 100 is enhanced because the card 302 of the double-wide functional module 300 can be operably positioned in a card cage 400 configured for use with single-wide cards, such as are employed by single-wide functional module 200. Moreover, it can readily be seen that such results may likewise be obtained with triple-wide, or larger, functional modules by incorporating appropriate geometric features into the cards of such functional modules, as necessary to accommodate a particular card cage structure or other environment wherein the functional module is intended to be employed.

Another aspect of the double-wide functional module 300 is that because it can be readily received in environments such as those disclosed herein, it substantially precludes the need, in at least some instances, to implement multi-channel applications in two separate functional modules. As noted elsewhere herein, the use of separate functional modules in multi-channel applications may give rise to a variety of problems relating to the installation and operation of the electronic equipment enclosure and related systems and components.

As suggested by the disclosure herein concerning the adapter element as selectively employed in connection with a card cage so as to enable, among other things, the use of double-wide and larger cards in the card cage, the presence of one or more adapter elements in the card cage has various useful implications, and the same is likewise true with respect to the absence of adapter elements from one or more card guides of the card cage. Examples of such implications are considered below.

With respect to the former case, where one or more adapter elements are present in the card cage, the installed adapter elements provide, among other things, a mounting point for the fasteners of the functional module. In addition, the channels defined on either side of the installed adapter elements serve to guide the edge of a single wide functional module as the single wide functional module is inserted into the card cage.

In the latter situation, the absence of the adapter element from the middle card guide, for example, means that the receptacle defined by the middle card guide is available to accommodate a double wide or larger functional module. Moreover, the absence of an adapter element from the middle card guide and the elimination of the center mounting fasteners from a double wide or larger functional module means that more space on the front panel is thus made available for connectors, indicators or other components.

Figure 5A:
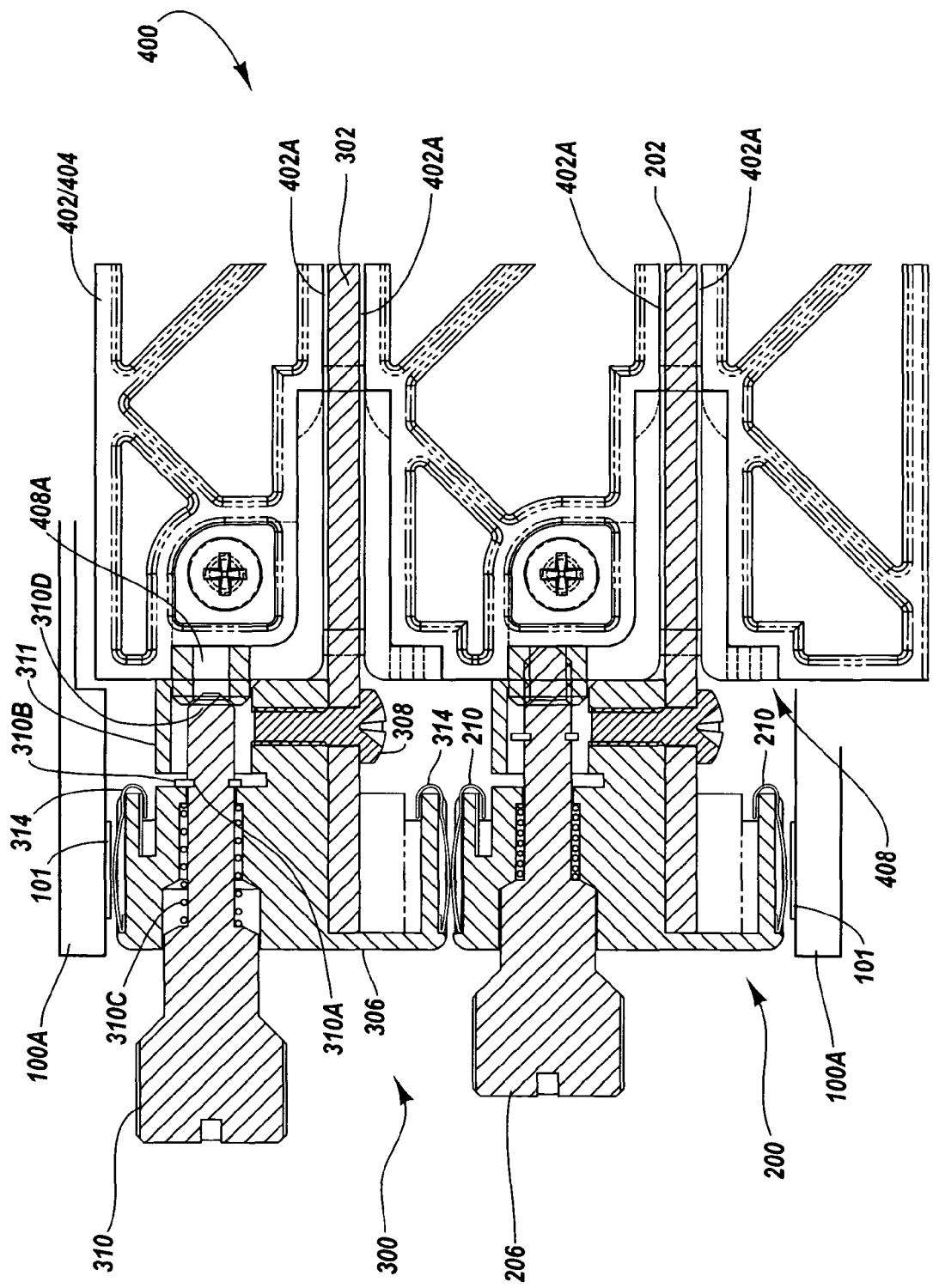
FIG. 5A is a section view, derived from the perspective view of FIG. 4A, illustrating aspects of the relation of an exemplary embodiments of single-wide and double-wide functional modules with an end card guide of a card cage when the functional modules are disposed in a vertically stacked arrangement in an electronic equipment enclosure.
Figure 5B:
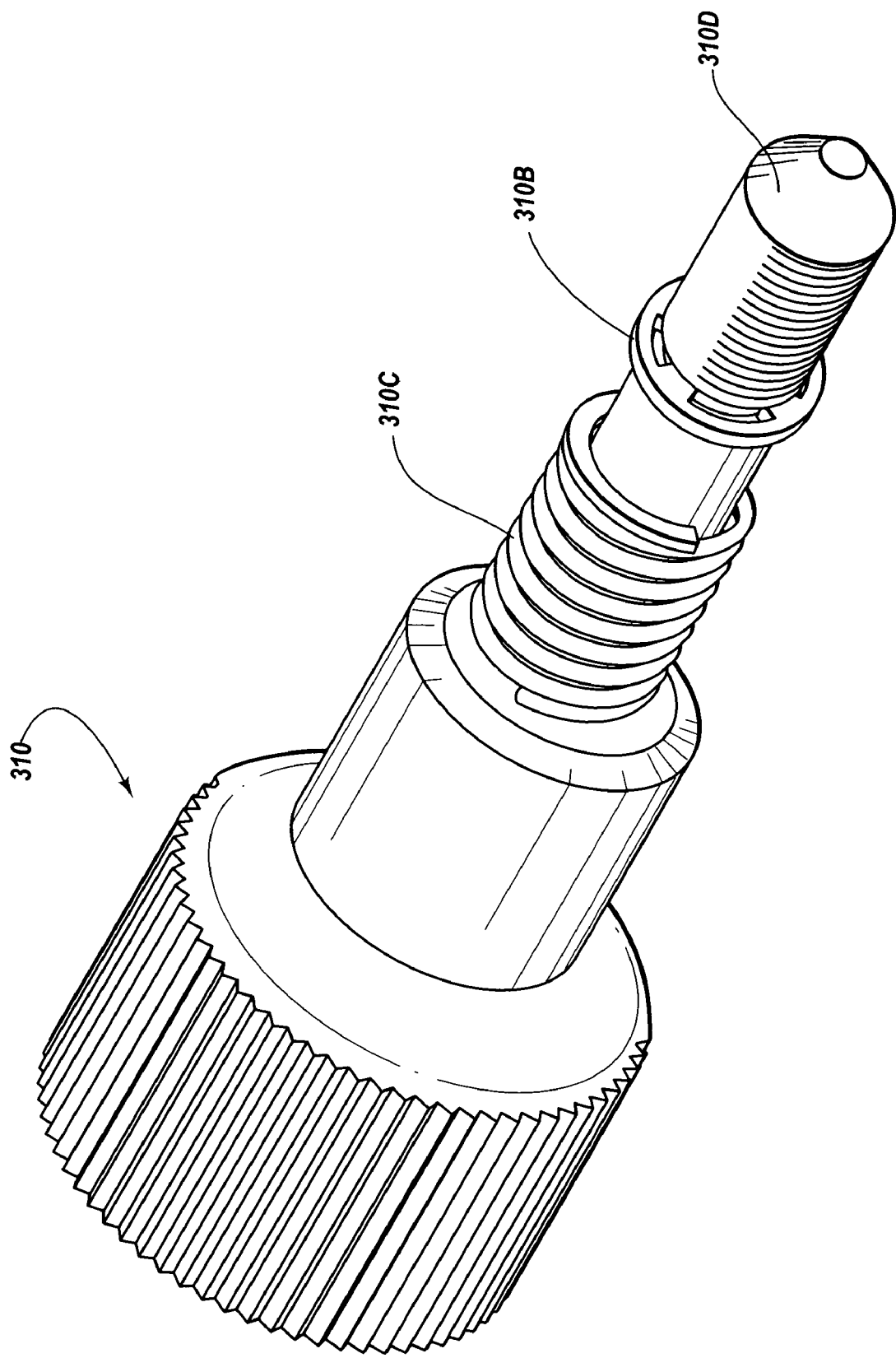
FIG. 5B is a perspective view illustrating various additional aspects of an exemplary embodiment of a fastener suited for use in the retention of a functional module in the card cage.
Figure 5C:
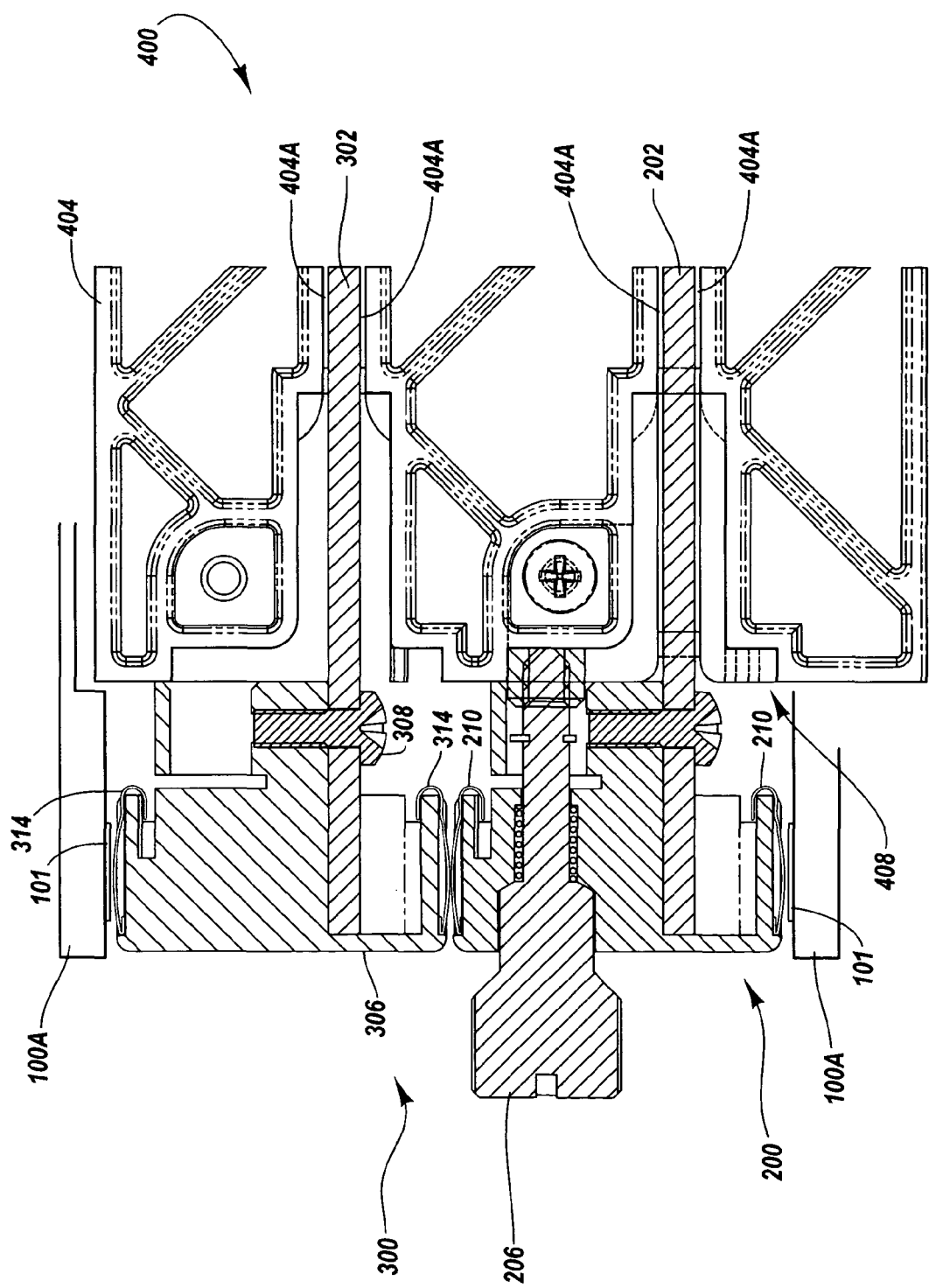
FIG. 5C is a section view, derived from the perspective view of FIG. 4A, illustrating aspects of the relation of an exemplary embodiments of single-wide and double-wide functional modules with a middle card guide of a card cage when the functional modules are disposed in a vertically stacked arrangement in an electronic equipment enclosure.

Directing attention now to FIGS. 5A through 5C, further details are provided concerning the attachment of the double-wide functional module 300 to the electronic equipment enclosure 100. With particular reference first to FIGS. 5A and 5B, the card 302, joined to front panel 306 by one or more fasteners 308 that pass through corresponding openings defined by card 302, is received, in this exemplary arrangement, by the adapter element 408 and the card guides. Once fully inserted into the card cage system 400, the double-wide functional module 300 is securely retained in position by the engagement of fasteners 310 with adapter elements 408. As indicated in FIGS. 5A and 5B, fastener 310 defines a circumferential slot 310A configured to receive an e-clip 3101B. In general, e-clip 3101B prevents fastener 310 from being fully withdrawn from double-wide functional module 300.

As further indicated in FIGS. 5A and 5B, a spring 310C is provided that serves to urge fastener 310 away from boss 408A of adapter element 408 when the fastener 310 is disengaged therefrom. Finally, a tapered nose portion 310D of fastener 310 aids in the initial alignment of fastener 310 with boss 408A which exemplarily includes a complementary countersink wherein tapered nose portion 310D is initially received. The tapered nose portion 310D also precludes binding of fastener 310 as it is brought into engagement with boss 408A. While the preceding discussion has primarily been directed to fastener 310, it should be noted that such discussion is equally germane to fasteners of other functional modules as well.

Thus, one aspect of the exemplary fastener 310 arrangement illustrated in FIG. 5A, and in FIG. 1, is that the fasteners 310 are positioned so as to not interfere with adjacent functional modules. This positioning of the fasteners 310 thereby facilitates stacking of the functional modules one above another, and/or side-by-side, and also permits the conductive elements 210 and 314, as applicable, to be positioned on the ends of the front panels 306 where the mounting flanges of conventional functional modules are typically located. This arrangement further permits substantial contact between conductive elements of adjacent functional modules, as suggested in FIG. 5A.

Directing attention finally to FIG. 5C, aspects of the disposition of double-wide functional module 300, and associated card 302, in the card cage 400 are indicated. In this exemplary arrangement, no adapter element 408 is present in middle card guide 404, and the opposing edges 302B of slot 302A defined by card 302 are received in channels 404A defined on either side of middle card guide 404 so that card 302 straddles middle card guide 404 and is supported thereby. As suggested in FIG. 5C, a single-wide functional module 200, for example, may simultaneously be disposed in card cage 400 at another card storage level.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A functional module configured to be received in an electronic equipment enclosure that includes a card cage, the functional module comprising:
    a front panel;
    a card that includes electronic circuitry, the card having first and second side edges and defining at least one cutout formed along at least half of the length of the card and having opposing edges and the at least one cutout being interposed between the first and second side edges so that when the functional module is received in the electronic equipment enclosure, the first and second side edges of the card are supported by first and second card guides, respectively, and the opposing edges of the at least one cutout defined by the card are supported by a third card guide when the functional module is received in the electronic equipment enclosure; and
    at least one connector attached to the card and configured for electrical communication with the electronic circuitry.

2. The functional module as recited in claim 1, wherein the card is at least double-wide.

3. The functional module as recited in claim 1, wherein the card is supported by the card cage at a second location between the side edges.

4. The functional module as recited in claim 1, further comprising at least two fasteners that pass through the front panel and are configured to removably engage the card cage, each of the fasteners defining a circumferential slot and comprising:
    an e-clip substantially disposed in the circumferential slot; and
    a spring disposed about a portion of the fastener.

5. The functional module as recited in claim 1, wherein the at least one connector is located proximate the front panel.

6. The functional module as recited in claim 1, wherein the at least one connector is located proximate a rear edge of the card.

7. In a functional module configured to be received in an electronic equipment enclosure that includes a card cage having a plurality of card guides disposed in a spaced apart arrangement, and the functional module including a front panel, a card configured to be attached to the front panel and comprising:
    a body having first and second side edges and defining at least one cutout formed along at least half of the length of the body and having opposing edges and the at least one cutout being interposed between the first and second side edges so that when the card is received in the electronic equipment enclosure, the first and second side edges of the card are supported by first and second card guides, respectively, and the opposing edges of the at least one cutout defined by the card are supported by a third card guide;
    electronic circuitry disposed on the body; and
    a plurality of conductive elements disposed about at least a portion of a perimeter of the front panel in a manner so as to reduce electromagnetic emissions from within the card cage.

8. The card as recited in claim 7, wherein the body is at least double-wide.

9. The card as recited in claim 7, wherein the card is supported by the card cage at a second location between the side edges.

10. The card as recited in claim 7, wherein the at least one cutout comprises a slot defined by the body, the slot extending a portion of the length of the body and being located substantially equidistant from each of the two side edges of the card.

11. In an electronic equipment enclosure having a card cage that includes, at least, first and second card guides, as well as a third card guide interposed between the first and second card guides in a spaced apart arrangement configured to receive two single-wide functional modules in an edge-to-edge position, a functional module configured to be removably received in the electronic equipment enclosure, the functional module comprising:
    a front panel;
    a card attached to the front panel and including electronic circuitry, the card having first and second side edges and defining at least one cutout formed along at least half of the length of the card and having opposing edges and the at least one cutout being interposed between the first and second side edges so that when the functional module is received in the card cage, the first and second side edges of the card are supported by the first and second card guides, respectively, and the opposing edges of the at least one cutout defined by the card are supported by the third card guide;
    a plurality of conductive elements disposed about at least a portion of a perimeter of the front panel in a manner so as to reduce electromagnetic emissions from within the card cage; and
    at least one connector attached to the card and configured for electrical communication with the electronic circuitry.

12. The functional module as recited in claim 11, wherein the at least one cutout comprises a slot defined by the card, the slot extending a portion of the length of the card.

13. The functional module as recited in claim 11, wherein the at least one cutout is located substantially equidistant from each of the two side edges of the card.

14. The functional module as recited in claim 11, wherein the card is at least double-wide.

15. The functional module as recited in claim 11, further comprising at least two fasteners that pass through the front panel and are configured to removably engage the card cage, each of the fasteners defining a circumferential slot and comprising:
    an e-clip substantially disposed in the circumferential slot; and
    a spring disposed about a portion of the fastener.

16. An electronics system, comprising:
an electronic equipment enclosure that includes a card cage having a plurality of card guides disposed in a spaced apart arrangement; and
at least one functional module configured to be removably received in the electronic equipment enclosure, the functional module comprising:
a front panel;
a card that includes electronic circuitry, the card having first and second side edges and defining at least one cutout formed along at least half of the length of the card and having opposing edges and the at least one cutout being interposed between the first and second side edges so that when the functional module is received in the electronic equipment enclosure, the first and second side edges of the card are supported by first and second card guides, respectively, and the opposing edges of the at least one cutout defined by the card are supported by a third card guide; and
at least one connector attached to the card and configured for electrical communication with the electronic circuitry.

17. The electronics system as recited in claim 16, wherein the card is at least double-wide.

18. The electronics system as recited in claim 16, wherein the card is supported by the card cage at a second location between the side edges.

19. The electronics system as recited in claim 16, wherein the functional module further comprises at least two fasteners that pass through the front panel and are configured to removably engage the card cage, each of the fasteners defining a circumferential slot and comprising:
an e-clip substantially disposed in the circumferential slot; and
a spring disposed about a portion of the fastener.

* * * * *

UNITED STATES PATENT AND TRADEMARK OFFICE
CERTIFICATE OF CORRECTION

PATENT NO. : 7,349,226 B2  Page 1 of 3
APPLICATION NO. : 10/638982
DATED : March 25, 2008
INVENTOR(S) : Ice It is certified that error appears in the above-identified patent and that said Letters Patent is hereby corrected as shown below:

Drawings
Sheet 1, replace Figure 1 with the figure depicted below, wherein the connectors 306 have been relabeled 312

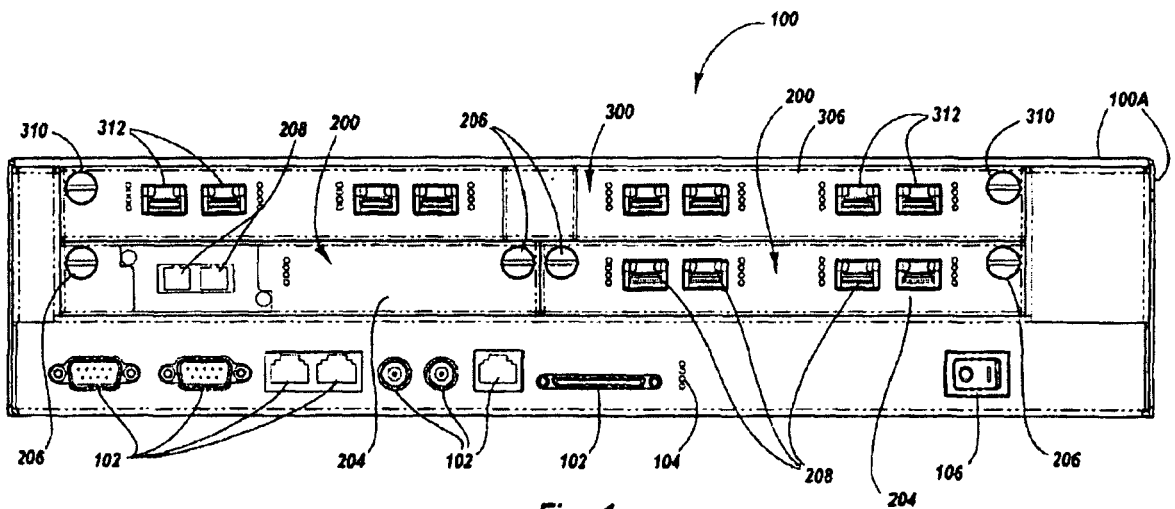

Fig. 1

Signed and Sealed this

Fourteenth Day of September, 2010

David J. Kappos
*Director of the United States Patent and Trademark Office*

CERTIFICATE OF CORRECTION (continued)
U.S. Pat. No. 7,349,226 B2

Sheet 2, replace Figure 2 with the figure depicted below, wherein the channel 404G has been relabeled 404A

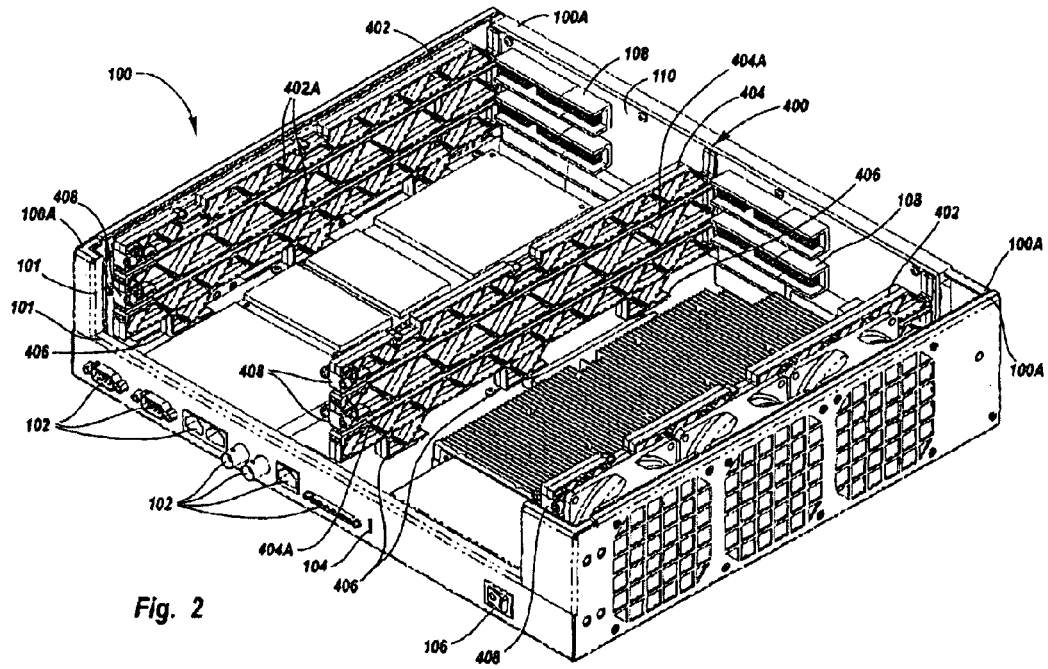

Fig. 2

Sheet 6, replace Figure 4B with the figure depicted below, wherein the channel 404B has been relabeled 404A and the channel 402B has been relabeled 404A

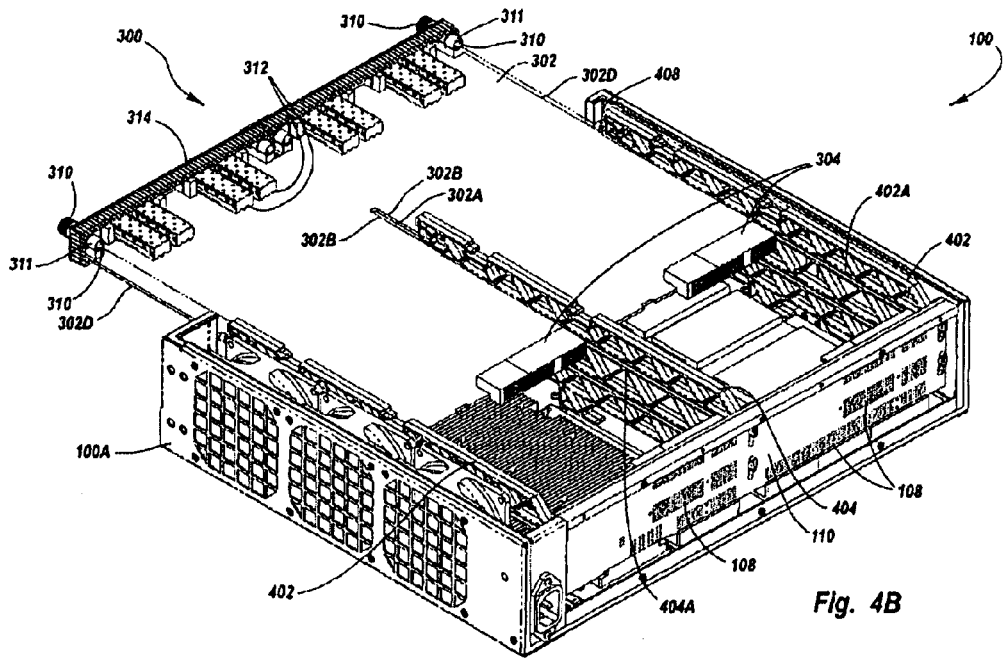

Fig. 4B

Column 6
Line 15, after "400", add [(see FIG. 2)]
Line 33, after "300", add [(see FIG. 1)]

Column 8
Line 5, change "302" to --302A--
Line 10, change "302" to --302A--
Line 46, change "304" to --302--
Line 60, after "100", add [(see FIG. 2)]
Line 63, change "1100" to --100--

Column 10
Line 30, after "100", add [(see FIG. 4A)]
Line 40, change "3101B" to --310B--
Line 40, change "3101B" to --310B--

Column 11
Line 6, after "302", add [(see FIG. 4A)]